United States Patent [19]
Schumann et al.

[11] Patent Number: 5,889,714
[45] Date of Patent: Mar. 30, 1999

[54] ADAPTIVE PRECHARGE MANAGEMENT FOR SYNCHRONOUS DRAM

[75] Inventors: Reinhard C. Schumann, Stow; Dean A. Sovie, Maynard; Mark J. Kelley, Marlboro, all of Mass.

[73] Assignee: Digital Equipment Corporation, Maynard, Mass.

[21] Appl. No.: 963,047

[22] Filed: Nov. 3, 1997

[51] Int. Cl.$^6$ .................................................. G11C 7/00
[52] U.S. Cl. ...................... 365/203; 365/189.12
[58] Field of Search .............................. 365/203, 49, 210, 365/189.12, 230.03

[56] References Cited

U.S. PATENT DOCUMENTS

| | | | |
|---|---|---|---|
| 5,448,719 | 9/1995 | Schultz et al. | 395/182.03 |
| 5,587,951 | 12/1996 | Jazayari et al. | 365/203 |
| 5,598,374 | 1/1997 | Rao | 365/203 |
| 5,600,601 | 2/1997 | Murakami et al. | 365/203 |
| 5,699,309 | 12/1997 | Cronin, III et al. | 365/203 |
| 5,745,428 | 4/1998 | Rao | 365/203 |

OTHER PUBLICATIONS

Hodges, D., "Microelectronic Memories," *Microelectronics* (A Scientific American Book), pp. 56–58 (Sep. 1977).
"What is Synchronous DRAM," download from PC Webopaedia, Jan. 1997.
"Synchronous Dynamic Random Access Memory (SDRAM)," download from PC Webopaedia, Jan. 1997.

*Primary Examiner*—Son T. Dinh
*Attorney, Agent, or Firm*—Hamilton, Brook, Smith & Reynolds, P.C.

[57] ABSTRACT

A memory controller such as for use with a synchronous dynamic random access memory (SDRAM) wherein an active row at the end of each transfer can either be left active or closed by precharging the row. The memory controller uses a history register to keep track of the results of a number of prior accesses to each memory bank, remembering whether the access was to the same row as an immediately prior access. For each new memory access, the memory controller either asserts or deasserts a precharge enable signal depending on the state of the history bits. As a result, the memory controller is more likely to have a correct row open on a subsequent access, and less likely to have a wrong row open.

18 Claims, 4 Drawing Sheets

ADAPTIVE PRECHARGE MANAGEMENT FOR SYNCHRONOUS DRAM

FIELD OF THE INVENTION

The present invention relates to data processing systems and in particular to precharge policy for a dynamic memory storage unit.

BACKGROUND OF THE INVENTION

Dynamic Random Access Memories (DRAMs) have long been a popular choice for use as main memory in computer systems, especially for low cost computer systems such as personal computers (PCs) and workstations. This is largely because DRAMs use a simple memory cell geometry that permits implementation of large memory arrays at minimum cost and power consumption on a single semiconductor chip.

However, as processor speeds increase beyond a certain point, DRAM technology has been found to have significant access time incompatibilities. This is because the switching speed within a conventional DRAM memory cell is not as fast as the switching speeds now common in central processing units (CPUs). As a result, when using high speed processors with conventional DRAMs, the processor must frequently wait for memory accesses to be completed.

DRAMs support a type of access known as page mode wherein adjacent locations can be accessed sequentially at high speed. This feature is particularly effective in memory intensive applications in which it is common for groups of memory locations to be read or written in sequential order.

In addition, in a DRAM, all of the cells in a given group of memory locations, or a so-called "row," are activated at the same time. Multiple read or write operations can thus be performed with various cells within the row, but only while it is active. If a new access is to be made to a different row, a precharge operation must be completed to close the presently active row prior to accessing a different row. Therefore, a delay equal to the precharge time is experienced whenever a different row must be accessed on a subsequent transaction. However, the precharge operation is only necessary if the row address changes; if the row address does not change on the subsequent access, the precharge operation has been unnecessarily executed and the device unnecessarily placed in an idle state.

A new type of DRAM, called a synchronous DRAM (SDRAM), is rapidly becoming a popular option for use as main memory. SDRAMs use the same memory cell technology as DRAMs, which is to say they use a single complimentary metal-oxide-semiconductor (CMOS) transistor switch coupled to a storage capacitor. There are, however, several differences in the internal structure of an SDRAM that provide certain speed advantages.

The first such difference is that the operation of an SDRAM is synchronous. In particular, read/write access and refresh cycles occur synchronously with a master clock signal. Therefore, a computer system can be designed using SDRAMs, knowing the exact timing of events within the memory.

Second, being synchronous, SDRAM arrays can be split into two or more independent memory banks, and two or more rows can therefore be active simultaneously, with one open row per independent bank. If a computer system is designed to support interleaved accesses to multiple rows, SDRAMs make it possible to complete these accesses without intervening precharge operations, provided that the rows to be accessed are all in separate SDRAM banks.

SUMMARY OF THE INVENTION

Briefly, the present invention is a memory controller for use with a dynamic random access memory (DRAM), such as a synchronous DRAM (SDRAM), or other memory which is of the type that requires the use of a precharge operation in which a row of active memory cells must be precharged and closed prior to subsequent access to different rows of the same memory bank. The memory controller includes precharge policy logic that generates a precharge enable logic signal based upon the contents of a history register. If the history register indicates that it is unlikely that the previous row address will be used on the next access, the precharge enable logic signal is asserted, and an auto-precharge cycle is performed which results in the present row being closed. However, if the history register indicates that the row address is likely to remain the same, the precharge enable logic signal is not asserted, and the presently open row is kept active.

Data for the history register is determined by comparing a present row address with a last previous row address and storing the result of this comparison. The results are stored in the history register for a predetermined number of prior accesses, such as by storing a logical "one" when the present row address matches the previous row address, and by storing a logical "zero" when they do not match.

The bits of the history register are examined to set the state of the precharge enable logic signal. The precharge enable logic signal is not asserted if the row address has been the same for a predetermined number of previous accesses. Otherwise, logic signal is asserted if row addresses have not been the same.

It is preferred that the precharge policy logic be implemented for each of the banks of a memory array, so that the banks may operate independently.

The precharge policy logic can also be designed such that more recent row address matches are weighted more heavily than less recent row address matches, or it can be designed to favor certain patterns of row address matches.

In addition, the precharge history register can be disabled by an optional input to the memory control circuit.

The invention is also a process for operating a DRAM array in which a memory array location is precharged if a predetermined number of prior row addresses have been different from one another.

The invention provides several advantages over prior art memory control schemes. In particular, the precharge policy logic, without main processor software intervention, automatically predicts when it is advantageous to keep rows open and when it is better to close the rows. As a result, it is more probable that rows will be active when it is most likely that the subsequent access will be to the same row. At the same time, it is more likely that rows will be closed and precharged when it is most likely that the next access will be to a different row.

BRIEF DESCRIPTION OF THE DRAWINGS

The above and further features of the invention include various novel details of construction and combination of components. These novel features will be more particularly pointed out in the following claims, and their advantages will also become evident as they are described in detail with reference to the accompanying drawings, in which:

DETAILED DESCRIPTION OF A PREFERRED EMBODIMENT

Figure 1:
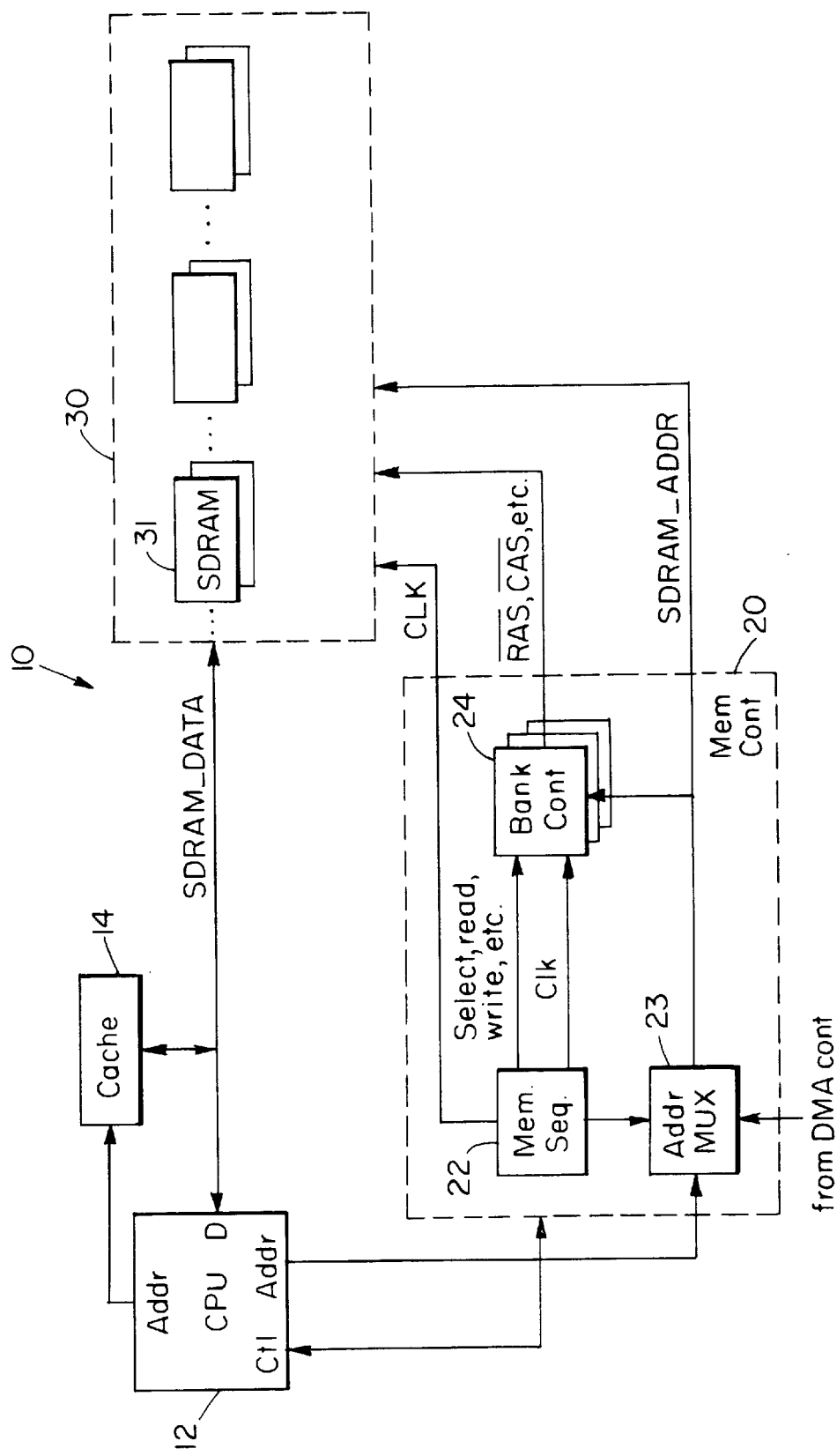
FIG. 1 is a block diagram of a computer system making use of a memory controller circuit according to the invention.

FIG. 1 is a block diagram of the core of a computer system 10 that includes a central processing unit (CPU) 12, a cache memory 14, a memory controller 20, and a main memory 30.

The processor 12 may be a high speed microprocessor such as the Alpha series microprocessors available from Digital Equipment Corporation of Maynard, Massachusetts. In general, the processor 12 runs software programs and communicates with cache 14 and main memory 20 and peripheral devices (not shown).

The memory controller 20 includes a memory sequencer 22, one or more memory bank controllers 24, and an address multiplexer 23. The memory controller 20 manages the interface between the system data bus 15 and the main memory 30. The memory controller 24 may be implemented as a subset of a larger core logic function that coordinates all memory and I/O accesses with the processor 12. The memory controller 24 may typically include hard wired logic circuits, gate arrays, or firmware programmable controllers.

The memory sequencer 22 provides high-level timing control for accesses to the memory 30. The memory sequencer 22 is responsible for issuing commands to start all transactions between the processor 12 and memory 30, including the selection of memory addresses, and the generation of command signals such as SELECT, to activate a memory location, and READ and WRITE, which initiate read and write transactions, respectively.

As illustrated, the address multiplexer 23 receives an address from the CPU 12 and provides a row address or column address to the memory 30 via the address signals SDRAM_ADDR in response to selection commands from the memory sequencer 22. In addition, the address multiplexer 23 may also receive addresses through a DMA controller (not shown).

The main memory 30 typically includes a number of high capacity semiconductor memory chips such as synchronous dynamic random access memories (SDRAMs) 31. The SDRAMs 31 may be arranged in a number of different configurations. As with most dynamic random access memories (DRAMs), each SDRAM chip 31 is arranged as an array of single bit memory cells. Individual memory cells are addressed by first asserting an n-bit row address that activates the cells in one of the $2^n$ rows. Later, an m-bit column address is asserted to select one of the $2^m$ storage cells located within the active row.

The memory sequencer 22 controls the operation of memory transactions by sending a number of signals to each of a number of memory bank controllers 24, there typically being a memory bank controller 24 for each of a number of sub-portions, or banks, of the main memory 30. The number of memory bank controllers 24 depends upon the maximum size of the memory 30, and particularly on the number of independent DRAM banks in the maximum memory configuration. The memory bank controller 24 and memory sequencer 22 are typically designed to support a wide number of different types of SDRAM chips and main memory 30 configurations. In the preferred embodiment, each memory bank controller 24 controls one bank within a group of SDRAM chips, as typically mounted on a so-called dual-in-line memory module (DIMM). In the preferred embodiment, the DIMMs contain one or two groups of SDRAMs and each SDRAM contains two or four independent banks. A total of sixty-four (64) memory bank controllers are provided to control up to eight DIMMs in the maximum configuration. To achieve higher memory bandwidth, multiple DIMMs can be arranged in parallel on a wider data path, and the preferred embodiment uses the DIMMs in pairs to implement a 144-bit wide system data bus 15.

Figure 2:
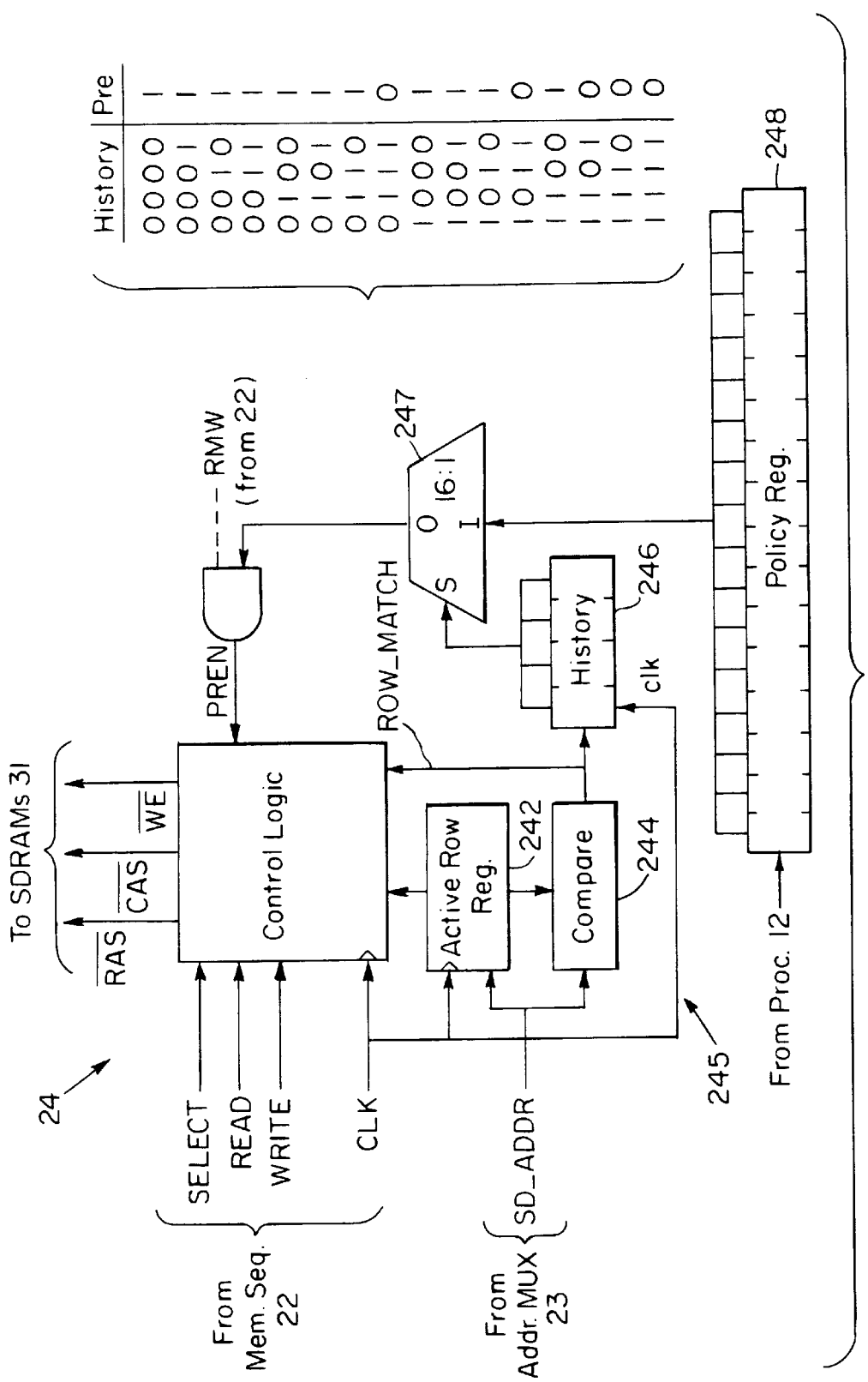
FIG. 2 is a more detailed circuit diagram of the precharge policy logic circuit used in the memory controller of FIG. 1.

A detailed block diagram of one of the memory bank controllers 24 is shown in FIG. 2. The memory bank controller 24 consists of control logic circuits 240, an active row register 242, a compare circuit 244, a history register 246, and policy register 248. The memory bank controller 24 accepts a number of control signals from the memory sequencer 22, including an open selected row signal SELECT, and read and write access signals including an initiate read signal READ, an initiate write signal WRITE, and an initiate read-modify-write signal RMW.

In response to these input signals, the control logic 240 generates certain control and command signals to the associated SDRAM chips 31 in a manner similar to other dynamic memory bank controllers. For example, a row address strobe RAS is used as a signal to activate a selected row of memory cells. A column address strobe CAS is then used to select a particular memory location within the active row for access. A write enable signal WE is used with the CAS signal to select a write operation in the selected memory cell. When CAS is asserted without WE, a memory read operation is performed. When RAS is asserted with WE, a precharge operation is performed. (Please note that the SDRAM control signals are generated in an inverted logic sense, as indicated by the lines over the signal names in the drawings.)

The SELECT input directs the control logic 240 to prepare a specified row for subsequent memory accesses. If the correct row is already open, as signaled by comparator 244, no action is needed. If no row is currently open, the control logic 240 opens the specified row by asserting RAS. If the wrong row is open, the control logic 240 must first close the wrong row, by asserting RAS with WE. The specified row can then be opened by asserting RAS, after the precharge operation has completed, and the generation of one or more row address strobe RAS by the control logic 240. Similarly, initiate READ and WRITE input signals generate one or more CAS and WE signals.

Before discussing the operation of the memory bank controller 24 in detail, it is helpful to understand certain characteristics of SDRAMs 31.

The storage array within a bank of an SDRAM is divided into rows. Before a row can be accessed, the bit lines of the memory array must be "precharged" to a consistent voltage, to provide adequate noise margin for sensing the relatively small read data charge. The use of the SDRAM bank consists of alternating precharge operations and row activations. A row can be left active for a relatively long period of time, and many read and write operations can be performed while the row is active. However, a precharge operation must always be performed before a new row is activated.

The precharge operation requires a fixed time interval to complete. Similarly, activation of a new row requires a fixed time interval to complete.

At the end of each read or write operation, a precharge operation can be done immediately. In this case, a new row activation is always needed before the next read or write operation, even if the new read or write is to same row as was used most recently. Alternatively, the row can always be left open. In this case, a subsequent read or write to the current row can proceed without delay, but a read or write access to a new row will require both a precharge operation and a new row activation.

In this invention, the memory bank controller 24 decides before each read or write operation whether to perform a precharge operation or whether to leave the current row open by omitting the precharge operation. This decision is made in accordance with a precharge policy implemented by a precharge policy logic circuit 245. The precharge policy logic 245 includes an active row register 242, a row address comparator 244, a history register 246, a multiplexor 247, and a policy data register 248.

The precharge policy logic 245 uses the prior row hit history as an index to select one of the bits of the policy data register, which then specifies whether a precharge operation is to occur. If the selected bit of the policy register is a "1," a precharge enable logic signal PREN is asserted to direct the control logic 240 to initiate a precharge operation at the end of the current read or write operation. If the selected bit of the policy register is a "0", the precharge enable signal PREN is not asserted, and the control logic 240 does not initiate a precharge operation, thereby leaving the current row open for subsequent accesses.

Figure 3:
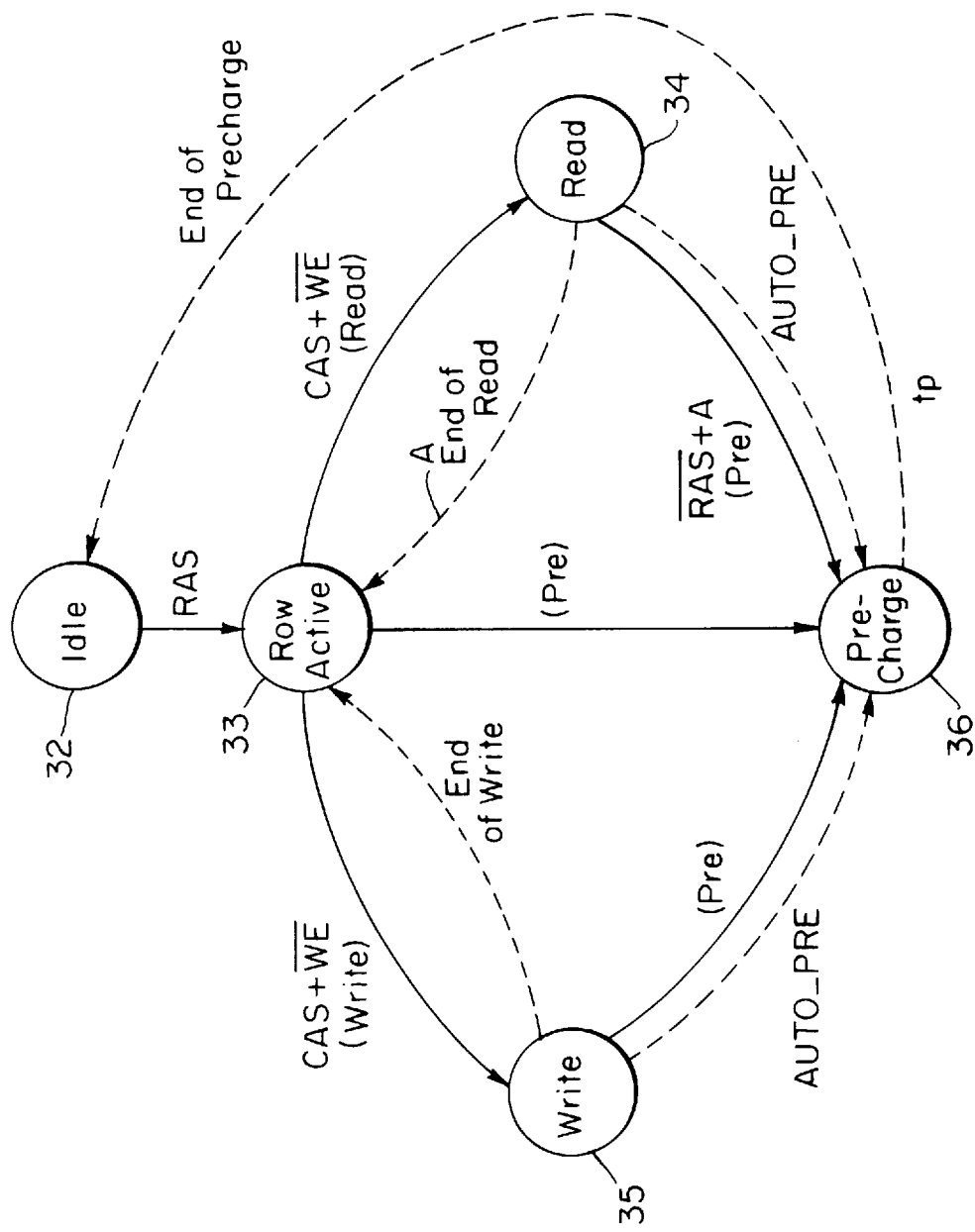
FIG. 3 is a state diagram of various states for the synchronous dynamic random access memory (SDRAM) shown in FIG. 1.

FIG. 3 illustrates a state transition diagram for a typical SDRAM 31 as shown, the SDRAM 31 begins in an idle state 32. Upon receipt of a row activate command, such as indicated by the assertion of the row address strobe RAS signal, the SDRAM 31 enters a state 33 in which a particular row is activated. The particular row activated is indicated by an n-bit address asserted at the same time as the RAS signal. The SDRAM device 31 remains in this state until a read or write transaction is initiated. In the case of a read transaction, as indicated by the assertion of the CAS signal without asserting the WE signal, the device enters a read state 34 in which data is read from a particular memory cell location in the active row. The cell accessed is indicated by an m-bit column address, which is typically also asserted at the same time as the CAS signal.

The device 31 remains in the read state 34 during the read operation. Upon completion of the read operation in state 34, the device automatically returns to the row active state 33, waiting to receive another command, unless a precharge operation is initiated at the end of the read operation. A precharge operation is typically initiated by asserting RAS and WE together. Alternatively, an automatic precharge can be commanded when the read operation is initiated, typically by a specific signal transferred on one of the SDRAM address bits when CAS is asserted. The preferred embodiment uses the automatic precharge method. (Automatic state transitions are indicated in FIG. 3 by dashed lines such as line A.)

If a precharge is initiated while the device 31 is in the read state 34, then the device enters a precharge state 36 after receipt of the next CLK signal rising edge. If the automatic precharge signal was asserted with CAS at the start of the read state, the transition to the precharge state 36 occurs automatically after the read operation is completed.

In this precharge state 36, the presently active row is closed for access and the bit lines in the SDRAM bank are precharged. Upon the passing of a particular time, tp which is the precharge time, the device 31 returns to the idle state 32 where it waits for another input.

The SDRAM device 31 also supports write operations in an analogous fashion. From the row active state 33 a write command may be given by asserting both the CAS and WE signals to enter a write state 35. The device 31 then writes data to the memory cell indicated by the address asserted at the same time as the CAS signal. At the end of the write operation 35, the SDRAM returns either to the row active state 33, or to the precharge state 36, depending on whether a precharge or automatic precharge was commanded. As in the case of the read operation, if the automatic precharge signal was asserted at the time of the write command, then transition from the write state 35 to the precharge state 36 occurs automatically.

It is incumbent upon the control logic 240 (as shown in FIG. 2) to issue row address strobe RAS, column address strobe CAS, write enable signal WE and the automatic precharge signal in the appropriate order, and with appropriate time intervals between operations, in order to avoid entering invalid states of the SDRAM 31. For example, if a memory address reference "hits" on an already open row, memory access latency is reduced due to the fact that only the CAS signal and lower order m-bit address need to be asserted. If however, the memory address reference "misses" on an open row, the open row must first be closed by initiating a precharge operation, and the minimum precharge interval tp must be observed before another row can be opened and accessed.

Figure 4:
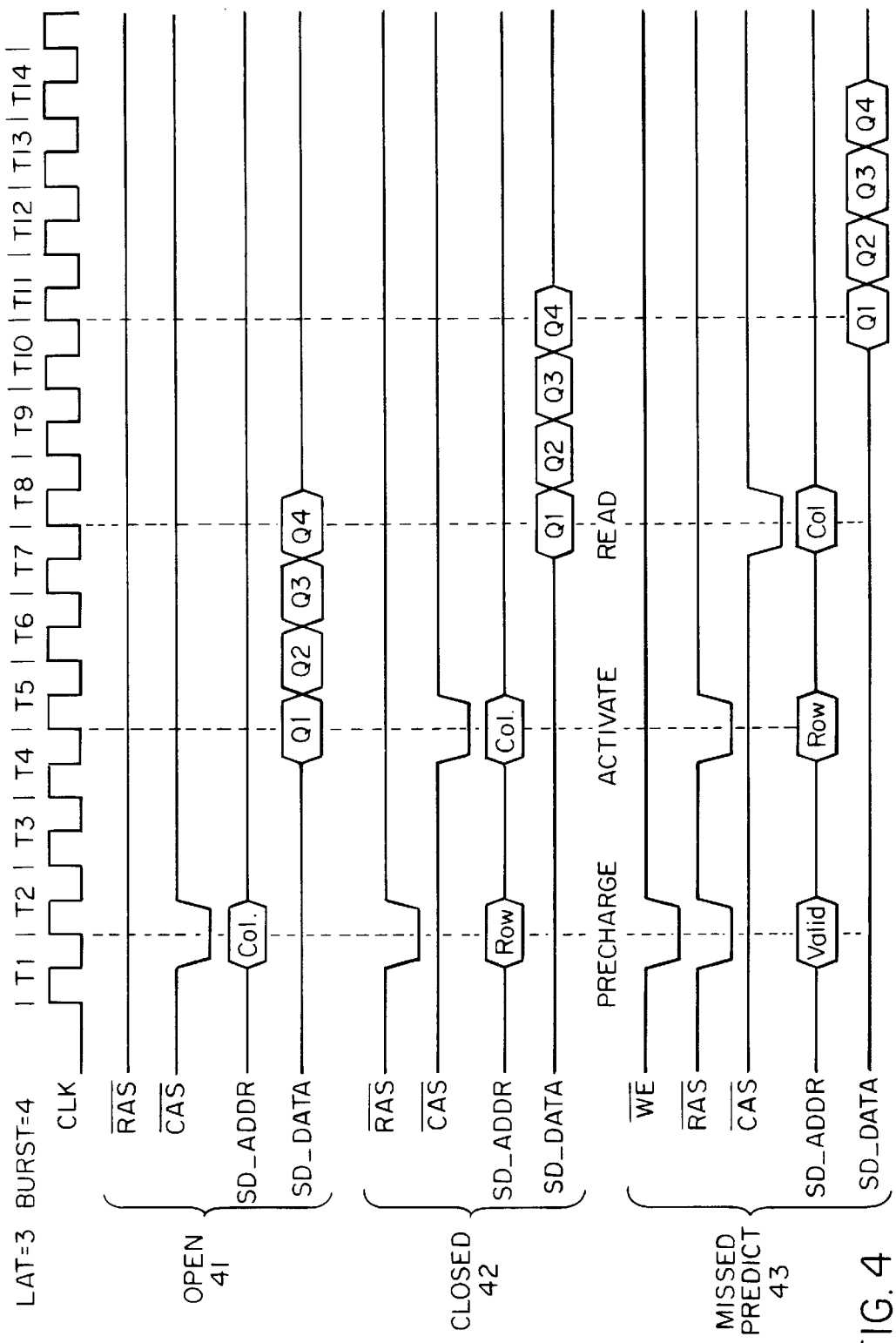
FIG. 4 is a timing diagram for certain types of read access cycles for the SDRAM of FIG. 3.

There are, therefore, three basic possible responses of the control logic 240 to the receipt of a memory SELECT input, as shown in FIG. 4. The signals are synchronous as with a clock signal CLK and occur in certain clock cycles t1, t2, . . . , t14. The timing diagrams are for an SDRAM 31 having a so-called CAS latency of three clock cycles and a RAS-to-CAS latency of three cycles, and a burst length of four locations.

In the simplest case, as indicated by the first group of logic signals 41, the device is in the active state 33 and the correct row is already open. In this instance, the row address strobe RAS need not be asserted, and during the first clock cycle t1 the column address strobe CAS may be asserted, together with the column address on the SD_ADDR lines. The data Q1–Q4 is then available at times t4, t5, t6, and t7.

In a second possible scenario, such as shown by the second group of signals 42, the device 31 is in the idle state 32 and no row is open. Thus, a row address strobe RAS must be asserted at time t1, together with a row address. After the appropriate RAS-to-CAS latency period, a column address strobe CAS and column address may be asserted, such as at clock cycle t4. The data Q1–Q4 is then available after the data access latency period, which in this instance, begins at clock cycle t7.

In the most complex case, as indicated by the third group of signals 43, the device 31 is in the row active state 33 but with the incorrect row being active. In this instance, the row must first be closed by issuing a precharge command at time t1 before the correct row can be opened by a subsequent RAS signal at clock cycle t4. By convention, the precharge command is typically signaled by RAS and WE together with a valid address, as shown in FIG. 4. Thus, at time t1, the precharge command is asserted, and the precharge latency period (three cycles in this example) must be allowed to elapse prior to asserting the row address strobe RAS signal to open the new row. In this case, the data Q1–Q4 does not begin to be available until time t10.

The control logic 240 therefore permits the memory sequencer 22 to simply assert SELECT, READ and WRITE signals without consideration of the present states of the SDRAM chip 31, that is, the memory control logic 240 contains appropriate logic circuits to delay the start of a read or write transaction until the correct row has been opened.

Returning attention now to FIG. 2, the memory bank controller 24 will be discussed in greater detail and in particular its use of the policy logic 245. As shown in FIG. 2, the controller 24 includes an active row register 242 and row address comparator circuit 244. The active row register 242 is arranged to receive the row address portion of the memory address inputs SD_ADDR at one input and the clock signal CLK at its clock terminal in order to store the address of the presently active row during a SELECT command. The contents of the active row register 242 are provided to the comparator circuit 244, together with the row address portion of the SD_ADDR inputs. In this manner, a row match signal ROW_MATCH is determined by the comparator circuit 244 during the beginning of a new access cycle. The ROW_MATCH signal is, for example, asserted when the presently active row address is the same as the new row address on the SD_ADDR inputs.

The history register 246 is preferably a four bit serial shift register connected to record the state of the ROW_MATCH signal, and shifting once for each occurrence of the SELECT signal The choice of four bits is somewhat arbitrary. If the shift register is made longer, it may be possible to provide better prediction accuracy, but at the expense of additional shift register bits and related logic. In the illustrated embodiment, the history register 246 records the "hit-or-miss" result of the row address comparator 244 for the previous four accesses to the associated bank of SDRAMS 31 under the control of a particular memory bank controller 24. That is, if the access to the bank is to the same row as the previous access, it is recorded as a hit and stored as a logic 1 in the history register 246, whether or not the row was kept open. Otherwise, the access is recorded as a miss and indicated as a logic 0 in the history register 246.

The four bits of the history register 246 are used as the index to control a multiplexer 247 that selects one of the sixteen bits of the policy data register 248 to determine the state of the logic signal PREN. The history register 246 in effect predicts whether the next access will be a hit or a miss, based on the prediction pattern defined by the policy data register 248 In the preferred embodiment, the policy data register is initialized to 0001 0111 0111 1111, which corresponds to a hit prediction for all cases where there are three or more hits during the last four accesses. For example, if the previous four accesses were all hits, the multiplexer 247 would select bit 15 of the policy register 248 predicts a hit by not asserting the precharge enable signal PREN, thereby leaving the row open. If the previous four accesses were all misses, it selects bit 0 of the policy data register, which predicts a miss and asserts PREN, thereby closing the row as quickly as possible.

The RMW signal from the memory sequencer 22 may be used with an optional logic gate 249 to unconditionally suppress the assertion of the precharge enable signal PREN. This avoids unneeded precharge operations between the read and write accesses of a read-modify-write sequence.

In the preferred embodiment, the contents of the policy data register 248 may also be written by software so that other prediction policies may be used if desired. For example, the operating software may load a prediction policy that has been determined experimentally to be optimal for the currently executing application program. If the policy data register 248 is programmed to 1111 1111 1111 1111, the PREN signal will always be asserted, so this policy effectively disables the predictor.

It can now be understand how the invention can be used to adapt to memory access patterns by predicting the next memory address access based upon a history of prior accesses. A precharge policy logic circuit according to the invention therefore attempts to follow an optimum strategy of sometimes keeping rows open and sometimes closing them. It should be understood that various changes and modifications may be made. There are numerous other possible designs for the prediction logic 245. For example, the prediction can be based on a history register containing more history bits, or additional history information can be kept, such as whether the access was a read or write, or how much time elapsed between successive accesses, or whether the accesses were originated from the CPU or from the DMA controller.

EQUIVALENTS

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments to the invention described specifically herein. Such equivalents are intended to be encompassed in the scope of the claims.

What is claimed is:

1. A memory controller comprising:
   a history-based predictor, for generating a predictor signal indicative of whether or not, for each of a predetermined number of past memory accesses, a memory row address is the same as a memory row address for a prior memory access; and
   a memory controller, responsive to the predictor signal, for initiating a memory precharge operation if the predictor signal indicates the memory row address has not been the same for the predetermined number of past memory accesses.

2. A memory controller as in claim 1 wherein the history-based predictor additionally comprises:
   a row address history register that stores data representative of memory row addresses for a number of past memory requests.

3. A memory controller as in claim 1 wherein the history-based predictor additionally comprises:
   a row address history register that stores data representative of whether or not, for each of a predetermined number of past memory access signals, a memory row address for a present memory access is the same as a memory row address for a prior memory access.

4. A memory controller as in claim 3 wherein the history storage register is a shift register.

5. A data processing system comprising:
   a central processing unit for generating memory address signals and memory access control signals;
   a synchronous dynamic random access memory including a plurality of storage cells arranged in a matrix of rows and columns, whereby (i) in response to receipt of a row address strobe signal, the storage cells located in a given row of the array as indicated by row address signals are activated for access, (ii) in response to a column address strobe signal, a given one of the storage cells in a presently activated row are enabled for access as indicated by column address signals, (iii) in response to receipt of a precharge command after a column address strobe signal, a presently activated row is closed, and (iv) in response to receipt of an auto-precharge signal during a column address strobe signal, a presently activated row is closed after access to that row is complete; and a memory controller, connected to receive the memory address signals and memory access control signals from the central processing unit, for generating the row address strobe, row address, column address strobe, column address, precharge, and auto-precharge signals, the auto-precharge signal being asserted or not asserted based upon a history record of prior row address signals, such that the auto precharge signal is asserted if the history record indicates that the row address corresponding to the presently active row is not likely to be used on a subsequent memory access, thereby closing the row, and such that the auto-precharge signal is not asserted if the history record indicates that the row address for a subsequent memory access is likely to be the same, thereby leaving the row active.

6. A data processing system as in claim 5 wherein the synchronous dynamic random access memory additionally is arranged into a plurality of memory banks, and the system additionally comprises:

a plurality of memory bank controllers, a memory bank controller being associated with each memory bank.

7. A data processing system as in claim 5 additionally comprising:

an active row address register connected to store, upon completion of each memory access, the row address of the presently active row;

a comparator, connected to compare the contents of the active row address register with the row address of the presently active row, and to generate a row match signal in response thereto, the row match signal being asserted if the contents of the active row address register are within a predetermined difference of the row address of the presently active row;

a row match history register, for storing a predetermined number of states of the row match signal for a predetermined number of memory accesses; and a precharge policy circuit, for generating the precharge enable signal based upon the contents of the row match history register, the precharge enable signal being not asserted if the row match history register indicates that for a second predetermined number of prior memory accesses, the row match signal was asserted.

8. A data processing system as in claim 6 wherein during a read modify write operation, the precharge enable signal is suppressed.

9. A data processing system as in claim 6 wherein the precharge policy circuit additionally, in response to receipt of a precharge policy enable signal, selectively enables or disables the auto-precharge signal.

10. A method for controlling a synchronous dynamic random access memory array comprising the steps of:

(a) activating storage cells located in a given row of the array in response to assertion of a row address strobe signal, thereby activating the given row;

(b) accessing the contents of at least one of the cells in the activated row in response to assertion of a column address strobe signal;

(c) in response to receipt of a row miss indication a precharge command is issued, deactivating the given row after the step of accessing that row is complete; and (d) asserting the auto-precharge signal by predicting whether a subsequent access will be to the same row as a present access.

11. A method as in claim 10 wherein the step of:

generating the precharge enable signal additionally comprises not asserting the auto-precharge signal if a predetermined number of the row accesses have been to the same given row.

12. A method as in claim 10 wherein the step of generating the precharge enable signal additionally comprises the step of:

asserting or deasserting the precharge enable signal based upon a row access history record of prior row access, such that the precharge enable signal is asserted if the row access history record indicates that the row address corresponding to the presently active row is not likely to be used on a subsequent memory access, thereby closing the row, and such that the precharge enable signal is not asserted if the row access history record indicates that the row address corresponding to the presently active row is likely to be used on a subsequent memory access, thereby leaving the row active.

13. A method as in claim 10 additionally comprising the steps of:

storing, upon completion of each accessing step (b), the row address of the presently active row in an active row register;

comparing the contents of the active row address register with the row address of a newly active row, to generate a row match signal in response thereto, the row match signal being asserted if the contents of the active row address register are the same as the row address of the newly active row;

storing a predetermined number of prior states of the row match signal for a predetermined number of memory accesses; and generating the precharge enable signal based upon the predetermined number of prior states of the row match register, the precharge enable signal being asserted if, for a second predetermined number of prior memory accesses, the row match signal was not asserted.

14. A method as in claim 10 wherein step (b) of accessing the contents of at least one of the cells in the activated row comprises the step of reading the contents of at least one cell.

15. A method as in claim 10 wherein step (b) of accessing the contents of at least one of the cells in the activated row comprises the step of writing the contents of at least one cell.

16. A method as in claim 13 additionally comprising the step of:

weighing individual states of the history record of prior accesses such that more recent memory accesses are accorded greater weight than less recent accesses.

17. A method as in claim 16 additionally comprising the step of:

determining multiple weightings of individual states of the history record to provide a plurality of precharge prediction outputs.

18. A method as in claim 17 wherein the step of determining multiple weightings additionally comprises:

selecting one of the precharge prediction outputs as the precharge enable signal.

* * * * *